US00RE48625E

(19) United States
(12) Reissued Patent
Cline et al.

(10) Patent Number: US RE48,625 E
(45) Date of Reissued Patent: *Jul. 6, 2021

(54) MEMORY CIRCUIT HAVING NON-VOLATILE MEMORY CELL AND METHODS OF USING

(71) Applicant: Lattice Semiconductor Corporation, Portland, OR (US)

(72) Inventors: Ronald L Cline, San Jose, CA (US); Stewart G. Logie, Campbell, CA (US)

(73) Assignee: Lattice Semiconductor Corporation, Portland, OR (US)

( * ) Notice: This patent is subject to a terminal disclaimer.

(21) Appl. No.: 15/975,506

(22) Filed: May 9, 2018

Related U.S. Patent Documents

Reissue of:
(64) Patent No.: 9,672,935
Issued: Jun. 6, 2017
Appl. No.: 14/887,174
Filed: Oct. 19, 2015

U.S. Applications:
(60) Provisional application No. 62/065,241, filed on Oct. 17, 2014.

(51) Int. Cl.
*G11C 7/16* (2006.01)
*G11C 17/18* (2006.01)
(Continued)

(52) U.S. Cl.
CPC ..... *G11C 17/18* (2013.01); *G11C 17/16* (2013.01); *G11C 16/10* (2013.01)

(58) Field of Classification Search
CPC ..... G11C 17/18; G11C 17/16; G11C 16/10
(Continued)

(56) References Cited

U.S. PATENT DOCUMENTS 7,042,756 B2 * 5/2006 Madurawe ..... G11C 7/18 257/E21.614
7,486,535 B2 * 2/2009 Perkins ..... G11C 17/16 365/195
(Continued)

OTHER PUBLICATIONS

Bai et al., "Stochastic-Based Spin-Programmable Gate Array with Emerging MTJ Device Technology," Journal of Low Power Electronics and Applications, Aug. 12, 2016, 23 Pages, vol. 6, No. 15.
(Continued)

*Primary Examiner* — Tuan H Nguyen
(74) *Attorney, Agent, or Firm* — Haynes and Boone, LLP

(57) ABSTRACT

One aspect relates to a memory circuit that has a programmable non-volatile memory (NVM) cell configured to generate an NVM output signal indicative of a program state of the NVM cell and to configure a volatile output based on the program state of the NVM cell. The NVM cell comprises a first anti-fuse device, a first select device connected in series with the first anti-fuse device at a first node, and a first pass device. The memory circuit also may have a programmable (independently of the NVM cell) volatile memory (VM) cell configured to receive the NVM output signal at a VM input node and to generate a VM output signal indicative of the program state of the VM cell. The NVM cell may have two NV elements that are separately programmable and are separately selectable via separate access transistors to drive the VM input node.

22 Claims, 9 Drawing Sheets

(51) Int. Cl.
*G11C 17/16* (2006.01)
*G11C 16/10* (2006.01)

(58) Field of Classification Search
USPC ..... 365/96
See application file for complete search history.

(56) References Cited

U.S. PATENT DOCUMENTS 7,796,417 B1* 9/2010 Lewis ..... G11C 11/16 365/148
8,604,572 B2 12/2013 Wang et al.
9,437,272 B1 9/2016 Lu et al.
9,520,173 B1 12/2016 Baker et al.
9,728,259 B1 8/2017 Jung et al.
2006/0028894 A1* 2/2006 Brennan ..... G11C 17/16 365/225.7
2006/0146596 A1* 7/2006 Madurawe ..... G11C 7/18 365/154
2007/0146012 A1* 6/2007 Murphy ..... B82Y 10/00 326/99
2008/0084724 A1 4/2008 Nozieres et al.
2008/0101146 A1* 5/2008 Paak ..... G11C 17/18 365/225.7
2008/0112220 A1* 5/2008 Lee ..... G11C 7/1078 365/185.2
2008/0237788 A1* 10/2008 Perkins ..... G11C 17/16 257/530
2010/0131812 A1* 5/2010 Mohammad ..... G11C 29/44 714/723
2013/0201746 A1* 8/2013 Chung ..... G11C 17/16 365/95
2014/0071726 A1 3/2014 Chung
2015/0310926 A1* 10/2015 Akamatsu ..... G11C 17/18 365/96
2015/0325316 A1* 11/2015 Kang ..... G11C 29/76 365/96
2016/0133335 A1* 5/2016 Kim ..... G11C 29/04 365/96

OTHER PUBLICATIONS

Choudhary et al., "A Review on Magnetic Tunnel Junction Technology," International Research Journal of Engineering and Technology (IRJET), Jul. 2015, pp. 1635-1639, vol. 2, Issue 4.
Goncalves et al., "Non-Volatile FPGAs Based on Spintronic Devices," 2013 50$^{th}$ACM/EDAC/IEEE Design Automation Conference (DAC), Jul. 18, 2013, 3 Pages, IEEE.
Tanamoto et al., "Scalability of Spin FPGA: A Reconfigurable Architecture Based on Spin MOSFET," J. Appl. Phys., Apr. 8, 2011, 3 Pages, arXiv:1104.1493v1.
Wang et al., "Tunnel Junction with Perpendicular Magnetic Anisotropy: Status and Challenges," Micromachines, Aug. 10, 2015, pp. 1023-1045, vol. 6.

* cited by examiner

MEMORY CIRCUIT HAVING NON-VOLATILE MEMORY CELL AND METHODS OF USING

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

*Notice: More than one reissue application has been filed for U.S. Pat. No. 9,672,935. The reissue applications are the present application and U.S. patent application Ser. No. 16/267,278, filed on Feb. 4, 2019, which is a continuation reissue of the present application.*

CROSS-REFERENCE TO RELATED APPLICATIONS

This application claims the benefit of the filing date of U.S. provisional application No. 62/065,241, filed on Oct. 17, 2014, which is incorporated herein by reference in its entirety for all purposes.

BACKGROUND

Field

In some aspects, the disclosure relates to electronics and, more specifically but not exclusively, to programmable non-volatile memory circuits.

Related Art

This section introduces aspects that may help facilitate a better understanding of the disclosure. Accordingly, the statements of this section are to be read in this light and are not to be understood as admissions about what is prior art or what is not prior art.

Non-volatile (NV) memory is used for configuration pattern storage for programmable logic devices such as field-programmable gate arrays (FPGAs). When this NV memory is external to the FPGA, the pattern is transferred to the FPGA's internal configuration static random-access memory (SRAM) through regular data pins. There are some product applications, however, where the NV memory block is internally embedded within the FPGA chip itself, so as to provide secure, independent configuration storage even when the FPGA is powered down. This memory pattern is normally transferred internally during chip power-up as an "initialization" sequence, with the data transfer most often taking place in the conventional fashion—as if the configuration pattern was externally presented to the FPGA's configuration controller even though the source is actually on chip.

SUMMARY

One aspect relates to a memory circuit comprising: a programmable non-volatile memory (NVM) cell configured to generate an NVM output signal indicative of a program state of the NVM cell comprising a first anti-fuse device (e.g., N1), a first select device (e.g., N2) connected in series with the first anti-fuse device at a first node, and a first pass device (e.g., N5) and a programmable volatile memory (VM) cell configured to receive the NVM output signal at a VM input node and to generate a VM output signal indicative of the program state of the VM cell, wherein the first pass device is connected between the first node and the VM input nod.

A further aspect relates to a method for operating a memory circuit comprising configuring the VM cell by pre-programming the VM cell to have a first programmed state independent of the NVM output signal; and then configuring the VM cell using the NVM cell such that, when the NVM cell is not programmed, the NVM output signal does not change the VM cell from the first programmed state; and when the NVM cell is programmed, the NVM output signal does change the VM cell to a second programmed state different from the first programmed state.

A method can involve, prior to configuring the VM cell, programming the NVM cell by turning off the first pass device; and turning on the first select device to apply a programmable voltage level across a gate oxide layer of the first anti-fuse device to create a permanent breakdown path through the gate oxide layer of the first anti-fuse device. The method can involve programming by turning off the first select device applying a read voltage to a gate of the first anti-fuse device, and turning on the first pass device, such that, when the NVM cell is programmed, the voltage at the VM input node is changed using sufficient current flow through the gate oxide layer of the blown first anti-fuse device by an amount sufficient to flip the VM output signal.

An article of manufacture comprising an FPGA fabricated entirely in a standard CMOS process with distributed SRAM configuration cells where at least a subset of the SRAM configuration cells have an associated and local non-volatile memory cell that is capable of programming its associated SRAM cell.

A further aspect relates to a NV memory cell for loading configuration data into a respective cell of volatile configuration memory. The NV memory cell is provided with its respective cell of volatile configuration memory and comprises a programmable voltage divider comprising a pair of anti-fuse devices coupled in series, wherein in a first programmed state, an output node is driven by a shorted voltage applied to the output node of the NV memory cell through one of the pair of anti-fuse devices and is on one side of a common-mode voltage, and in a second programmed state, the output node is driven by a shorted voltage applied to the output node of the NV memory cell through the other anti-fuse device of the pair and is on the other side of the common-mode voltage for the NVM cell.

BRIEF DESCRIPTION OF THE DRAWINGS

Embodiments and implementations of the disclosure will become more fully apparent from the following detailed description, the appended claims, and the accompanying drawings in which like reference numerals identify similar or identical elements.

DETAILED DESCRIPTION

Detailed illustrative embodiments of the present invention are disclosed herein. However, specific structural and functional details disclosed herein are merely representative for purposes of describing example embodiments of the present invention. The present invention may be embodied in many alternate forms and should not be construed as limited to only the embodiments set forth herein. Further, the terminology used herein is for the purpose of describing particular embodiments only and is not intended to be limiting of example embodiments of the invention.

As used herein, the singular forms "a," "an," and "the," are intended to include the plural forms as well, unless the context clearly indicates otherwise. It further will be understood that the terms "comprises," "comprising," "includes," and/or "including," specify the presence of stated features, steps, or components, but do not preclude the presence or addition of one or more other features, steps, or components. It also should be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

The time taken for initialization of an FPGA can be in the hundreds of milliseconds, especially for more-complex programmable devices. The latency incurred from this initialization delay can be detrimental to system operation. In addition, the energy (power times duration) of this initialization sequence can be so significant that power-reduction approaches, which include power-gating of the FPGA configuration storage, do not give a net improvement in energy usage, even at moderate power-cycle frequencies. Therefore, it is advantageous to utilize an approach which reduces both the power and the duration of this initialization process.

Current methods to reduce the initialization latency are generally based on parallelization of the transfer circuitry, which reduces the overall delay but does not affect the total energy and thus giving no advantage towards achieving power reduction during initialization. Moreover, the latency issue is improved, but not eliminated.

Figure 1:
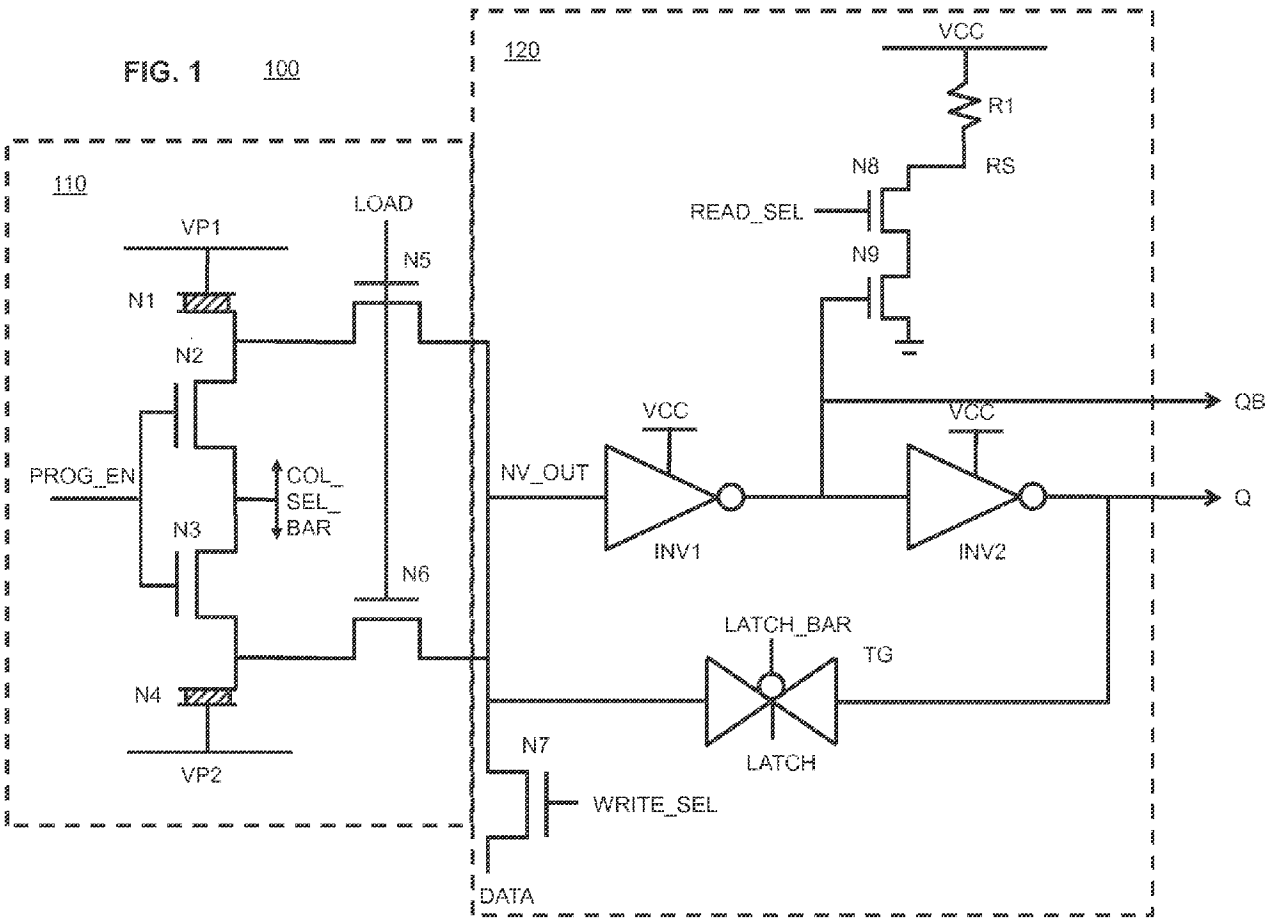
FIG. 1 is a schematic circuit diagram of a memory circuit for storing at least one bit of information, according to one embodiment of the invention.

FIG. 1 is a schematic circuit diagram of a memory circuit 100 for storing at least one bit of information, according to one embodiment of the invention. Memory circuit 100 will typically be one of many instances of similar memory circuits distributed over an integrated circuit, such as an FPGA. As described in further detail below, various voltage signals are applied to the different input nodes of memory circuit 100 to selectively store one bit of information into the memory circuit and then subsequently read that stored bit of information from the memory circuit, where the bit of information is represented by the voltage levels at the output node Q, the complementary output node QB, and the read-sense node RS.

Depending on the logic applied downstream of the memory circuit 100, a (relatively) high voltage level at node Q, a corresponding (relatively) low voltage level at node QB, and a corresponding (relatively) high voltage level at node RS may be interpreted as either a 1 or a 0, while the opposite voltage levels will be interpreted as the other bit value. For simplicity of description, the following discussion assumes that a bit value of 1 is represented by high voltages at nodes NV_OUT, Q, and RS, while a bit value of 0 is represented by low voltages at those nodes. Those skilled in that art will understand that an integrated circuit can be implemented using the complementary logic convention.

As shown in FIG. 1, memory circuit 100 has two memory cells configured together: a programmable, differential, non-volatile memory (NVM) cell 110 and a programmable, volatile memory (VM) cell 120, where VM cell 120 is an SRAM cell with a latch architecture. NVM cell 110 comprises N-type (e.g., transistor) devices N1-N6, while VM cell 120 comprises N-type (e.g., transistor) devices N7-N9, inverters INV1 and INV2, and transmission gate TG.

NVM cell 110 can be programmed to present either a (relatively) high voltage level (i.e., bit value 1) or a (relatively) low voltage level (i.e., bit value 0) at the NVM-cell output node NV_OUT. In particular, to program NVM cell 110 to present a high voltage level at node NV_OUT, a suitable sequence of programming voltages can be applied to (the previously unprogrammed) NVM cell 110 to result in a breakdown of the relatively thin gate oxide layer of anti-fuse device N1 resulting in a permanent conduction path through that gate oxide layer. In that case, when a suitable sequence of transfer voltages are applied to NVM cell 110, the output node NV_OUT will be driven high.

Alternatively, to program NVM cell 110 to present a low voltage level at node NV_OUT, a different, suitable sequence of programming voltages can be applied to (the previously unprogrammed) NVM cell 110 to result in a breakdown of the relatively thin gate oxide layer of anti-fuse device N4 resulting in a permanent conduction path through that gate oxide layer. In that case, when the same, suitable sequence of transfer voltages are applied to NVM cell 110, the output node NV_OUT will be driven low.

VM cell 120 can also be programmed to present either high voltage levels or low voltage levels at the VM-cell output nodes Q and RS and corresponding a low or high voltage level at the complementary VM-cell output node QB. In particular and for example, to program VM cell 120 to present a high voltage level (i.e., bit value 1) at node RS, a suitable sequence of write voltages can be applied to VM cell 120 to latch in a high voltage level at the input of inverter INV1. In that case, when a suitable sequence of read voltages are applied to VM cell 120, the output node RS will be driven high.

Alternatively, to program VM cell 120 to present a low voltage level (i.e., bit value 0) at node RS, a different, suitable set of write voltages can be applied to VM cell 120 to latch in a low voltage level at the input of inverter INV1. In that case, when the same, suitable sequence of read voltages are applied to VM cell 120, the output node RS will be driven low.

VM cell 120 can also be programmed by transferring the bit value stored in NVM cell 110 into VM cell 120 by applying a suitable sequence of transfer voltages to both NVM cell 110 and VM cell 120. Note that the bit value transferred from NVM cell 110 into VM cell 120 can be subsequently changed by re-programming the VM cell 120 as described previously.

Figure 2:
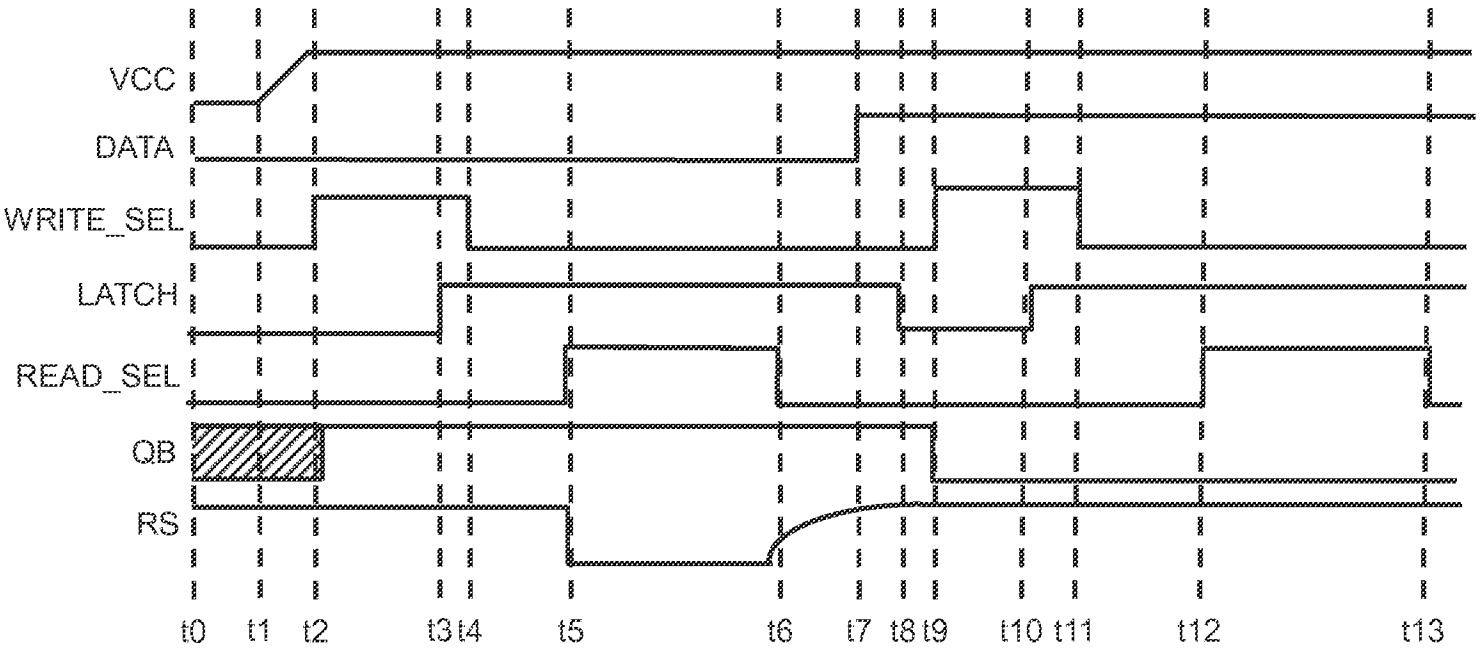
FIG. 2 is a set of waveforms representing a suitable sequence of voltages used to write and read a bit value into and out of the volatile memory (VM) cell of FIG. 1.

FIG. 2 is a set of waveforms representing a suitable sequence of voltages used to write and read a bit value into and out of VM cell 120 of FIG. 1. In particular, the waveforms of FIG. 2 represent the following sequence of operations: (i) program VM cell 120 by writing a bit value of 0 into the VM cell, (ii) then read the stored bit value 0 from the VM cell, (iii) then re-program the VM cell by writing a bit value of 1 into the VM cell, and (iv) then read the stored bit value 1 from the VM cell. During these operations, the (programmed or unprogrammed) NVM cell 110 is disabled and isolated from VM cell 120 by setting all of the following voltage levels low (e.g., to 0V): PROG_EN, COL_SEL_BAR, VP1, VP2, and LOAD.

In particular, as shown in FIG. 2, at time t0, the integrated circuit is powered off and, at time t1, the integrated circuit is powered on with the power supply voltage VCC rising from 0V to its operating level. To store the bit value 0 into VM cell 120, with the data voltage DATA and the latch voltage LATCH both low, the write-select voltage WRITE_SEL is driven high at time t2, which turns on the write device N7, which allows the low DATA voltage to appear at the input of inverter INV1. This, in turn, drives the output of inverter INV1 (i.e., node QB) high and the output of inverter INV2 (i.e., node Q) low. Prior to this time, the voltages at nodes QB and Q were indefinite.

At time t3, the latch voltage LATCH is driven high, which turns on the transmission gate TG, which enables the low voltage at node Q to be fed back to the input of inverter INV1. At time t4, the voltage WRITE_SEL is driven low, which turns off device N7 and latches the bit value 0 into VM cell 120.

To read the bit value 0 from VM cell 120, at time t5, the read-select voltage READ_SEL is driven high, which turns on the read device N8. With node QB high, device N9 will also be on, which drives node RS low. At time t6, the voltage READ_SEL is driven low, thereby ending this read operation of VM cell 120. Note that, when READ_SEL is driven low, the read device N8 is turned off, and node RS is driven high through resistor R1.

To re-program VM cell 120 to store the bit value 1, at time t7, the data voltage DATA is driven high, and, at time t8, the latch voltage LATCH is driven low to turn off the gate TG and isolate the input to inverter INV1 from node Q. At time t9, the write-select voltage WRITE_SEL is driven high to turn on the write device N7 and allow the high DATA voltage to appear at the input of inverter INV1. This, in turn, drives node QB low and node Q high. At time t10, the latch voltage LATCH is driven high to turn on gate TG and enable the high voltage at node Q to be fed back to the input of inverter INV1. At time t11, the voltage WRITE_SEL is driven low to turn off device N7 and latch the bit value 1 into VM cell 120.

To read the bit value 1 from VM cell 120, at time t12, the read-select voltage READ_SEL is driven high, which turns on the read device N8. With node QB low, device N9 will be off, which allows node RS to stay high. At time t13, the voltage READ_SEL is driven low, thereby ending this second read operation of VM cell 120.

Figure 3:
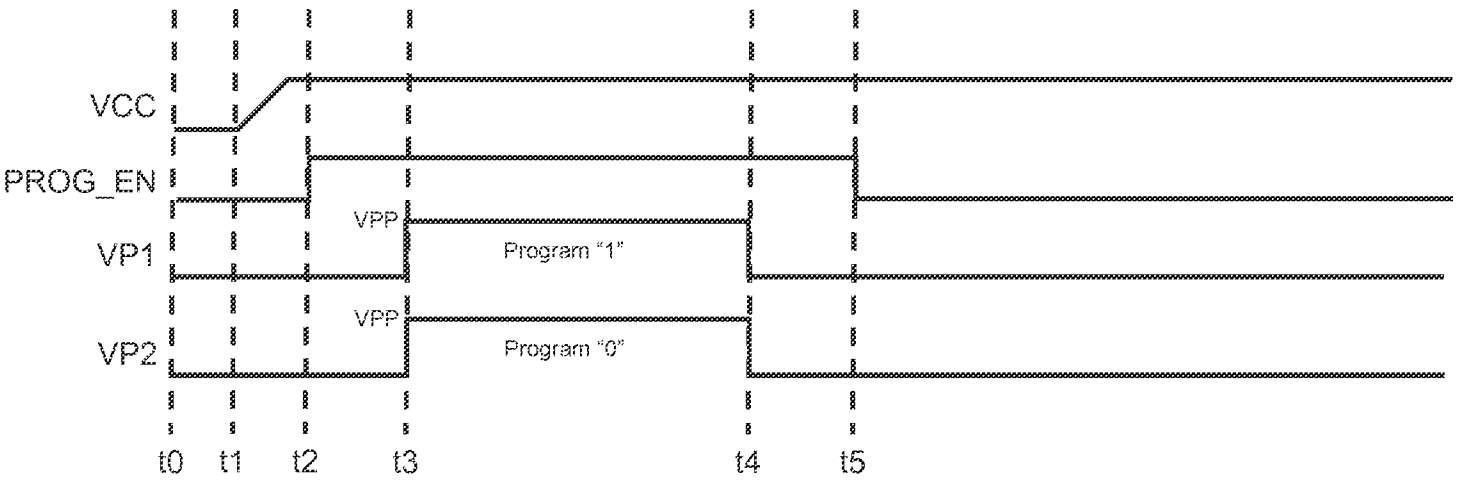
FIG. 3 is a set of waveforms representing a suitable sequence of voltages used to program a bit value into the non-volatile memory (NVM) cell of FIG. 1.

FIG. 3 is a set of waveforms representing a suitable sequence of voltages used to program a bit value into NVM cell 110 of FIG. 1. During this operation, all of the following voltage levels are set low: DATA, LATCH, WRITE_SEL, READ_SEL, LOAD, and COL_SEL_BAR, such that the VM cell 120 is disabled and isolated from NVM cell 110. Note that VM cell 120 does not have to be disabled in order to program NVM cell 110; it is sufficient for VM cell 120 to be isolated from NVM cell 110.

FIG. 3 represents two different scenarios in a single timing diagram: (i) the waveforms for programming the NVM cell 110 to have a bit value of 1 (in which case, the first programming voltage VP1 is driven high while the second programming voltage VP2 remains low) and (ii) the waveforms for programming the NVM cell 110 to have a bit value of 0 (in which case, the first programming voltage VP1 remains low while the second programming voltage VP2 is driven high).

At time t0, the integrated circuit is powered off and, at time t1, the integrated circuit is powered on with the power supply voltage VCC rising from 0V to its operating level. At time t2, the program-enable voltage PROG_EN is driven high, which turns on access devices N2 and N3. To store a bit value of 1 into NVM cell 110, at time t3, the voltage VP1 is driven to a high programming voltage level VPP, which is greater than VCC, while the voltage VP2 remains low (not explicitly shown in FIG. 3). With VP1 at VPP and VP2 and COL_SEL_BAR both at 0V, the voltage across the gate oxide layer of anti-fuse device N4 will be about 0V, while the voltage across the gate oxide layer of anti-fuse device N1 will be about VPP, resulting in the permanent breakdown of that relatively thin gate oxide layer. At time t4, VP1 is driven low, and, at time t5, PROG_EN is driven low, ending this particular programming operation. At this point, the anti-fuse device N1 has been blown, and the NVM cell 110 has been permanently programmed with the bit value 1.

Alternatively, to store a bit value of 0 into NVM cell 110, at time t3, VP2 is driven to VPP, while VP1 remains low (not explicitly shown in FIG. 3). In this case, with VP2 at VPP and VP1 and COL_SEL_BAR both at 0V, the voltage across the gate oxide layer of anti-fuse device N1 will be about 0V, while the voltage across the gate oxide layer of anti-fuse device N4 will be about VPP, resulting in the permanent breakdown of that relatively thin gate oxide layer. At time t4, VP2 is driven low, and, at time t5, PROG_EN is driven low, ending this particular program operation. At this point, the anti-fuse device N4 has been blown, and the NVM cell 110 has been permanently programmed with the bit value 0.

Figure 4:
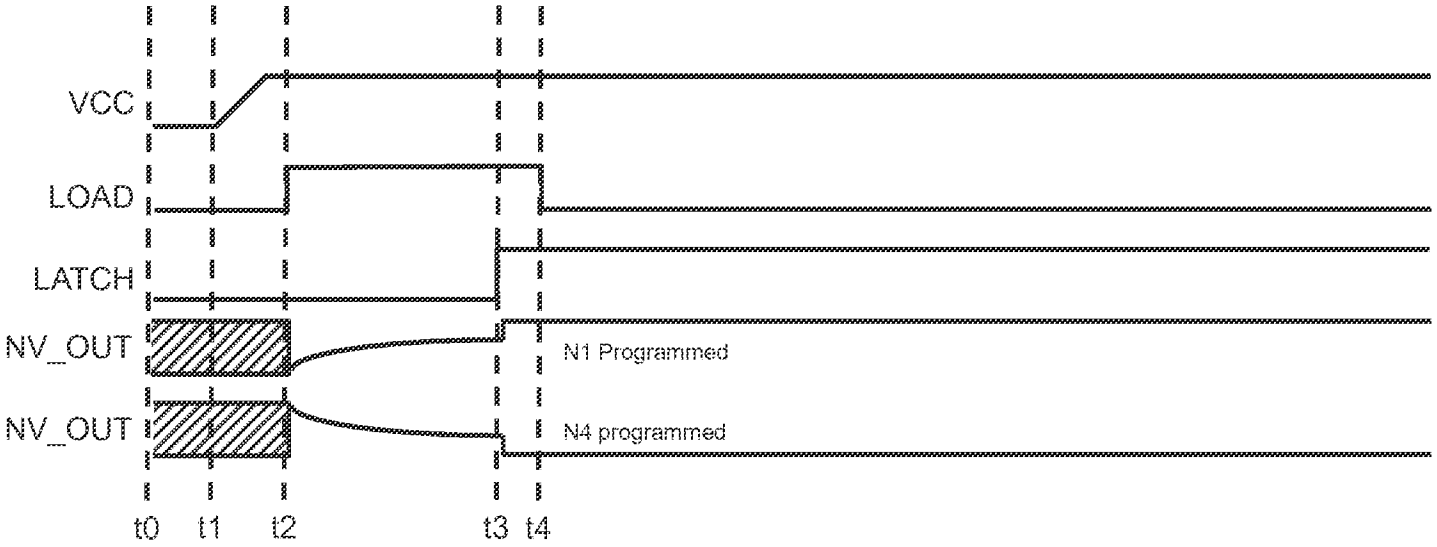
FIG. 4 is a set of waveforms representing a suitable sequence of voltages used to transfer the stored bit value from the programmed NVM cell to the VM cell of FIG. 1.

FIG. 4 is a set of waveforms representing a suitable sequence of voltages used to transfer the stored bit value from the programmed NVM cell 110 to VM cell 120 of FIG. 1. During this operation, all of the following voltage levels are set low: PROG_EN, VP2, DATA, WRITE_SEL, READ_SEL, and COL_SEL_BAR, while VP1 is at VCC. FIG. 4 presents two different waveforms for the voltage at node NV_OUT: (i) one for the situation in which device N1 was previously blown and (ii) another for the situation in which device N4 was previously blown.

At time t0, the integrated circuit is powered off and, at time t1, the integrated circuit is powered on with the power supply voltage VCC rising from 0V to its operating level. At time t2, the transfer-enable voltage LOAD is driven high, which turns on transfer devices N5 and N6. Prior to time t2, the voltage at node NV_OUT is indeterminate. After time t2, with devices N5 and N6 on, node NV_OUT will be driven either high or low depending on the programming of NVM cell 110. In particular, if NVM cell 110 is programmed with a bit value 1, then node NV_OUT will be driven high through turned-on transfer device N5 and the broken gate oxide layer of blown anti-fuse device N1. Alternatively, if NVM cell 110 is programmed with a bit value 0, then node NV_OUT will be driven low through turned-on transfer device N6 and the broken gate oxide layer of blown anti-fuse device N4. At time t3, the voltage LATCH is driven high to turn on transmission gate TG and latch the transferred bit value into VM cell 120. At time t4, LOAD is driven low, ending this transfer operation. At this point, the VM cell 120 is isolated from the NVM cell 110 and latched with the transferred bit value, which will appear at output node Q. Note that, to read the latched value at node RS, the read operation of FIG. 2 can be performed.

The various operations represented in FIGS. 2-4 can be used to perform various functions. At the time that the NVM cell 110 is programmed, it is desirable to verify that the desired bit value has been successfully stored in the NVM cell. As such, as soon as the program operation of FIG. 3 has been performed to program the NVM cell 110, the transfer operation of FIG. 4 can be performed to transfer the stored bit value from the NVM cell 110 into the VM cell 120, then the read operation of FIG. 2 can be performed to read the transferred bit value from the VM cell 120 at node RS, and then processing (e.g., external to memory circuit 100) can be performed to verify that the desired bit value has been successfully stored in the NVM cell 110. Similarly, to verify that VM cell 120 is operating properly, the write and read operations operation of FIG. 2 can be performed intermittently to determine whether a single event upset (SEU) incident has occurred that changes the bit value stored in VM cell 120.

Note that, in typical integrated circuits, the output nodes Q and QB will be used for on-line operations, while the output node RS will be reserved for circuit testing and programming verification.

Because the VM cell 120 can be isolated from the NVM cell 110, the VM cell 120 can be selectively programmed and re-programmed both before and after an NVM-stored bit value has been transferred from the NVM cell 110 to the VM cell 120. Furthermore, even after the VM cell 120 has been re-programmed to have a different bit value, the transfer operation can be repeated to re-program the VM cell 120 with the NVM-stored bit value. This functionality is useful in many integrated circuit applications.

On the other hand, there may be integrated circuits for which VM-programmability is not needed. In that case, it might not be necessary to be able to transfer and latch an NVM-stored bit value from NVM cell 110 into a volatile memory cell, like VM cell 120, that can retain the value after the NVM cell 110 has been isolated. As such, in an alternative embodiment, some or all of the transmission gate TG and the devices N7-N9 may be omitted. In that case, inverters INV1 and INV2 may be said to form volatile memory circuitry that is not a programmable VM cell per se. As such, after the NVM cell 110 has been programmed, as long as appropriate NVM transfer voltages are applied, the NVM-stored bit value will be continuously presented at the output node Q and its complement at the output node QB.

NVM cell 110 can be said to function as a programmable resistor-divider network. Before either N1 or N4 is blown, with transfer devices N5 and N6 on, the divided voltage at node NV_OUT will be midway between the voltages at VP1 and VP2 with both N1 and N4 functioning as capacitors. If N1 is blown, then the divided voltage at node NV_OUT will shift towards the voltage at VP1 with N1 functioning as a resistor and N4 still functioning as a capacitor. On the other hand, if instead N4 is blown, then the divided voltage at node NV_OUT will shift towards the voltage at VP2 with N4 functioning as a resistor and N1 still functioning as a capacitor.

Although memory circuit 100 has been described as storing either a bit value of 1 by blowing anti-fuse device N1 or a bit value of 0 by blowing anti-fuse device N4, memory circuit 100 can also be operated in a different mode. In particular, memory circuit 100 can be programmed to store a first bit value by selectively blowing or not blowing anti-fuse device N1. At some later time, memory circuit 100 can be re-programmed to store a second bit value, independent of the first bit value, by blowing anti-fuse device N1 (if it was not previously blown) and then selectively blowing or not blowing anti-fuse device N4. Note that this sequence can be reversed by storing the initial bit value using anti-fuse device N4 and then the subsequent bit value using anti-fuse device N1.

When multiple instances of memory circuit 100 are used to store a single set of configuration data, such capability effectively squares the probability of a failure. In particular, if one of the memory circuits fails because its first anti-fuse device was not sufficiently blown, then all of the memory circuits can be programmed a second time using the other anti-fuse device. In that case, the programming of the second anti-fuse device will correct the faulty programming of the failed memory circuit and reinforce the programming of the remaining, correctly programmed memory circuits The chances of the same memory circuit being incorrectly programmed twice is the square of its chances of being incorrectly programmed the first time alone.

Figure 5:
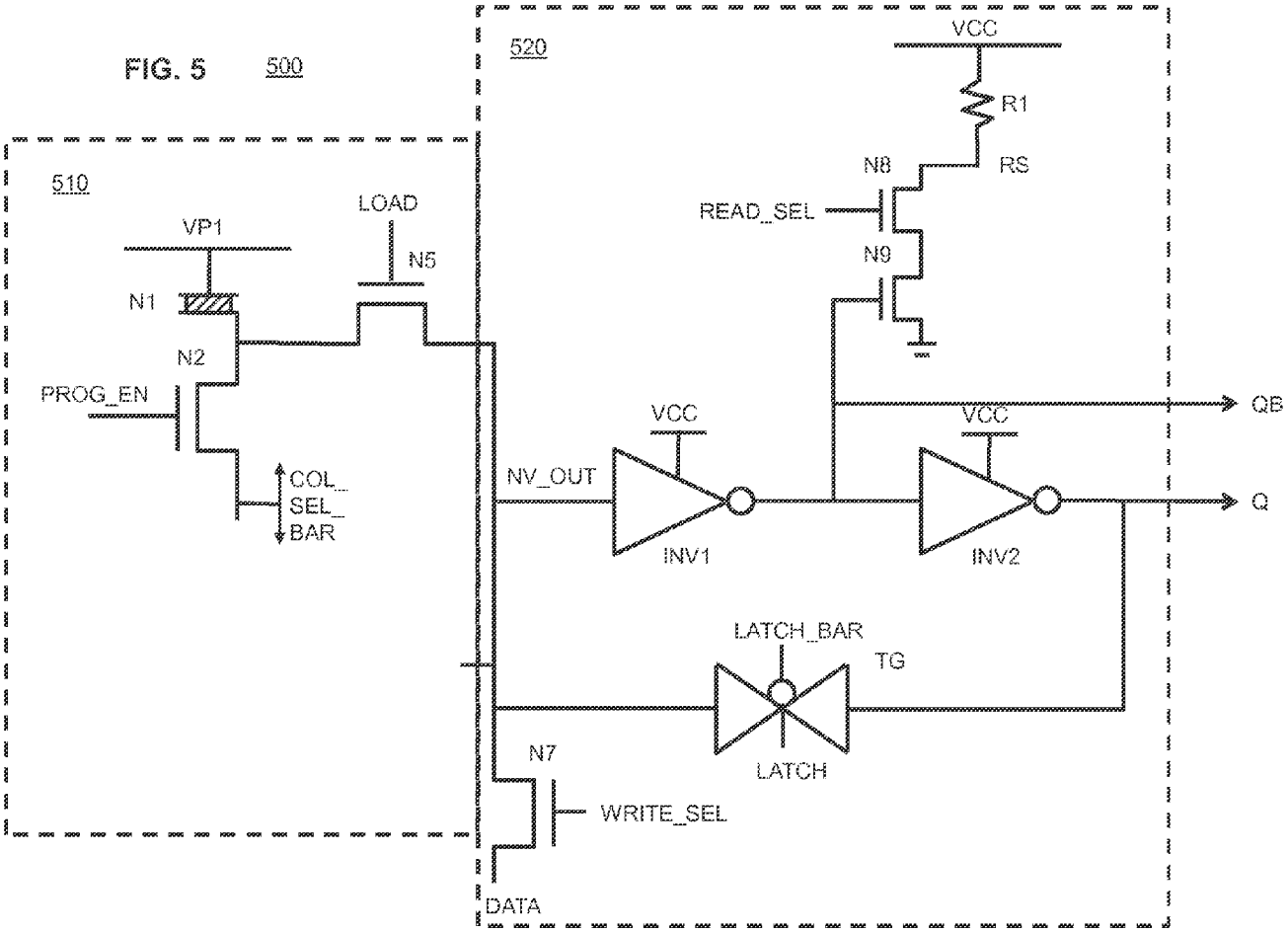
FIG. 5 is a schematic circuit diagram of a memory circuit for storing one bit of information, according to another embodiment of the invention.

FIG. 5 is a schematic circuit diagram of a memory circuit 500 for storing one bit of information, according to another embodiment of the invention. Memory circuit 500 is analogous to memory circuit 100 of FIG. 1, except that, instead of having the differential NVM cell 110, memory circuit 500 has a single-sided NVM cell 510 comprising only devices N1, N2, and N5, which are similar to the corresponding devices in NVM cell 110. The VM cell 520 of memory circuit 500 is identical to the VM cell 120 of FIG. 1 and can be written to and read from using the same waveforms of FIG. 2.

Unlike NVM cell 110 of FIG. 1, which has no default stored bit value, NVM cell 510 has a default stored bit value of 0 (i.e., corresponding to a relatively low voltage level at the NVM output node NV_OUT). As such, the programming of an "unprogrammed" NVM cell 110 involves the storing of a bit value of 1 into the NVM cell, in particular, by blowing the anti-fuse device N1 by breaking its gate oxide layer.

Figure 6:
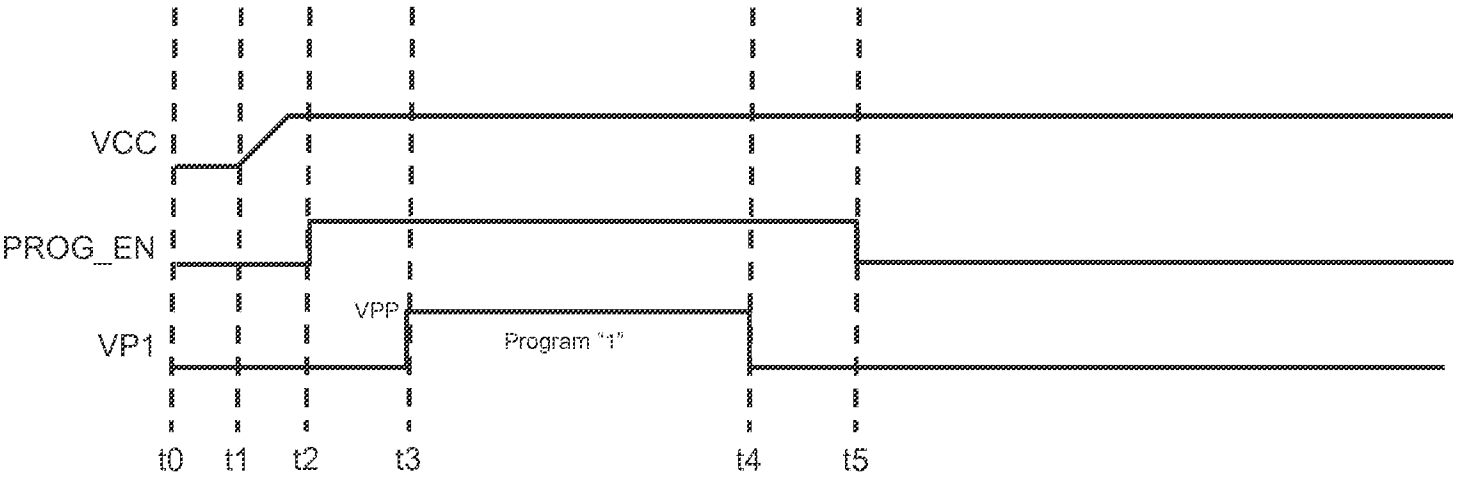
FIG. 6 is a set of waveforms representing a suitable sequence of voltages used to program a bit value of 1 into (the previously unprogrammed) NVM cell of FIG. 5.

FIG. 6 is a set of waveforms representing a suitable sequence of voltages used to program a bit value of 1 into (the previously unprogrammed) NVM cell 510 of FIG. 5. During this operation, all of the following voltage levels are set low: DATA, LATCH, WRITE_SEL, READ_SEL, LOAD, and COL_SEL_BAR, such that VM cell 520 is disabled and isolated from NVM cell 510. Note that VM cell 520 does not have to be disabled in order to program NVM cell 510; it is sufficient for VM cell 520 to be isolated from NVM cell 510.

At time t0, the integrated circuit is powered off and, at time t1, the integrated circuit is powered on with the power supply voltage VCC rising from 0V to its operating level. At time t2, the program-enable voltage PROG_EN is driven high, which turns on access device N2. At time t3, the program voltage VP1 is driven to the high programming voltage level VPP. With VP1 at VPP and COL_SEL_BAR at 0V, the voltage across the gate oxide layer of anti-fuse device N1 will be about VPP, resulting in the permanent breakdown of that relatively thin gate oxide layer. At time t4, VP1 is driven low, and, at time t5, PROG_EN is driven low, ending the program operation. At this point, the anti-fuse device N1 has been blown, and the NVM cell 510 has been permanently programmed with the bit value 1.

Figure 7:
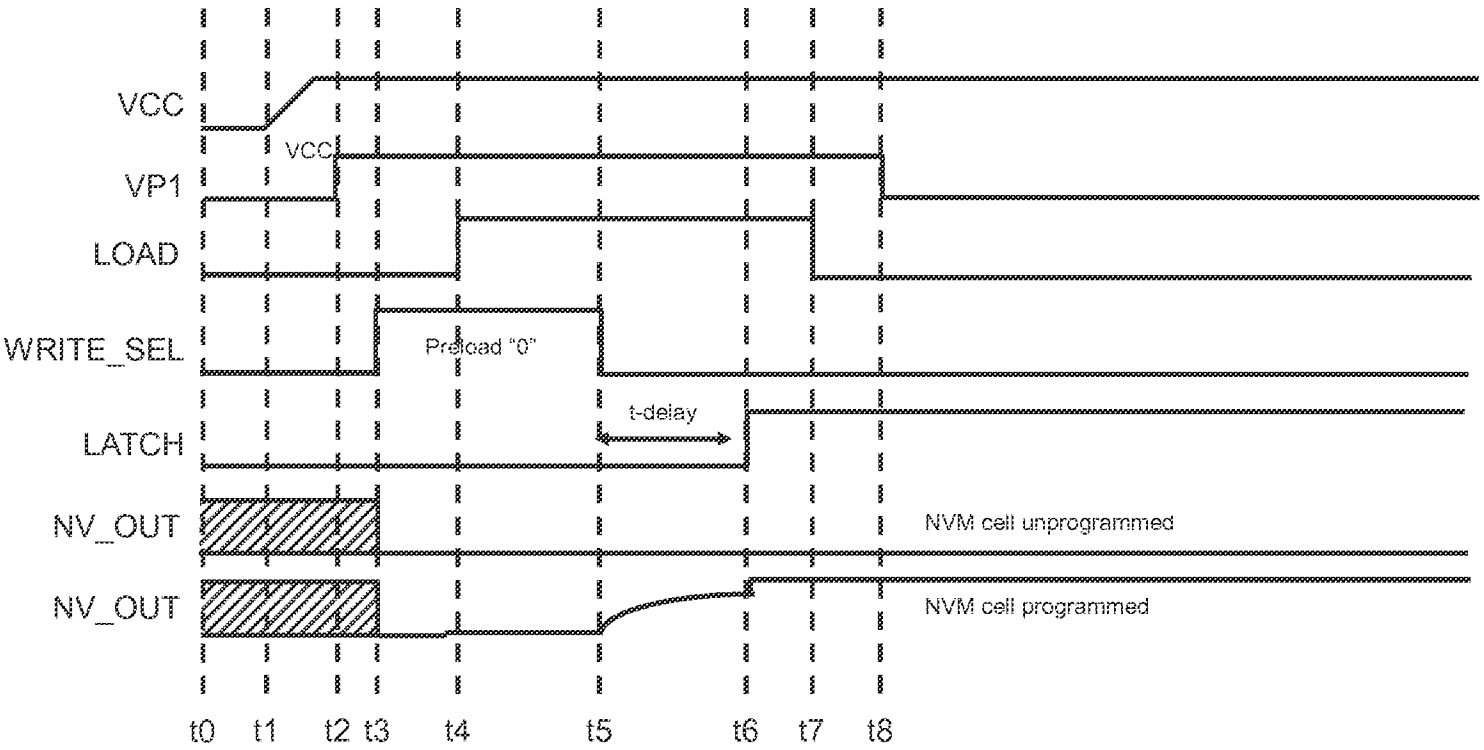
FIG. 7 is a set of waveforms representing a suitable sequence of voltages used to transfer the stored bit value from the NVM cell to the VM cell of FIG. 5.

FIG. 7 is a set of waveforms representing a suitable sequence of voltages used to transfer the stored bit value from NVM cell 510 to VM cell 520 of FIG. 5. During this operation, all of the following voltage levels are set low: PROG_EN, DATA, READ_SEL, and COL_SEL_BAR. Note that, because NVM cell 510 has a default stored bit value of 0, before the NVM-stored bit value is transferred from the NVM cell into VM cell 520, the VM cell is "pre-programmed" to have the bit value 0. As such, if NVM cell 510 still has its default stored bit value of 0 (i.e., N1 has not been blown), then, when the transfer operation of FIG. 7 is subsequently performed, VM cell 520 will retain its pre-programmed bit value of 0. If, however, NVM cell 510 has been programmed to have a stored bit value of 1 (i.e., N1 has been blown), then, when the transfer operation of FIG. 7 is subsequently performed, the VM cell 520 will be re-programmed with a bit value of 1.

As in FIG. 4, FIG. 7 presents two different waveforms for the voltage at node NV_OUT: one for the situation in which device N1 was not previously blown (i.e., NVM cell 510 was not previously programmed and therefore retains its default bit value 0) and one for the situation in which device N1 was previously blown (i.e., NVM cell 510 was previously programmed to store the bit value 1).

In particular, at time t0, the integrated circuit is powered off and, at time t1, the integrated circuit is powered on with the power supply voltage VCC rising from 0V to its operating level. At time t2, the voltage VP1 is driven to the supply voltage level VCC. At time t3, the write-enable voltage WRITE_SEL is driven high, which will turn on write device N7. Prior to time t3, the voltage at the NVM-cell output node NV_OUT was indeterminate. Since DATA is low, turning on the write device N7 drives the node NV_OUT low.

At time t4, the transfer-enable voltage LOAD is driven high, which turns on transfer device N5. At time t4, with device N5 on, node NV_OUT will be driven depending on the programming of NVM cell 510. In particular, if NVM cell 510 is not programmed (i.e., device N1 is not blown), then the voltage at node NV_OUT will remain low. Alternatively, if NVM cell is programmed (i.e., device N1 is blown), then the voltage at node NV_OUT will rise slightly but will remain relatively low due to the greater resistance of the blown device N1 than the turned-on device N7.

At time t5, WRITE_SEL is driven low, thereby turning off device N7 and isolating the node NV_OUT from the data signal DATA. If NVM cell 510 is not programmed, then the voltage at node NV_OUT will still remain low. Alternatively, if NVM cell 510 is programmed, then the voltage at node NV_OUT will begin to rise as charge flows through the blown device N1 and the turned-on device N5 to node NV_OUT. After a sufficient amount of time (t-delay), the voltage at node NV_OUT will have risen to a sufficiently high level to ensure that the data has been transferred from NVM cell 510 into VM cell 520. After that time delay, at time t6, the latch signal LATCH is driven high to turn on the transmission gate TG and latch in the transferred bit value. During the first transfer after programming, in order to verify that the NVM cell 510 has been properly programmed, a margin may be subtracted from the t-delay value to decrease the programmed N1 resistance required to properly sense and latch a bit value of 1.

At time t7, LOAD is driven low to isolate the VM cell 520 from the NVM cell 510, and, at time t8, the voltage VCC can be removed from the gate of device N1, ending the transfer operation. At this point, the VM cell 120 is latched with the transferred bit value, which will appear at output node Q. Note that, to read the latched value at node RS, the read operation of FIG. 2 can be performed.

Similar to memory circuit 100 of FIG. 1, the various operations represented in FIGS. 2, 6, and 7 can be used to perform similar functions for memory circuit 500.

Note that, in alternative embodiments of memory circuits 100 and 500, the series-connected transistors N8 and N9 may be connected to the node Q, instead of the node QB, with a corresponding inversion of the logic applied to interpret the corresponding voltage level.

A set of NVM cells, such as one or more instances of NVM cell 110 of FIG. 1 and/or one or more instances of NVM cell 510 of FIG. 5, can be programmed to store configuration data for an integrated circuit, such as an FPGA. When the FPGA is initially powered up, the configuration data can be transferred from those NVM cells to corresponding VM cells. By distributing and co-locating instances of the NVM cells with corresponding instances of the VM cells throughout the FPGA, the amount of energy used during such configuration operations and the time that is takes to perform those operations can both be significantly lower than for comparable integrated circuits that use co-located arrays of NVM cells to store and transfer configuration data to distributed VM cells. As such, certain embodiments of this invention provide low-energy, distributed (zero-latency) NVM cells with minimal penalty in terms of both silicon area and process complexity. In general, memory circuits of the invention may provide one or more of the following advantages:

- Differential comparison with unprogrammed NVM cell maximizes yield and system-level reliability;
- "Live at power-up" capability;
- Elimination of the power supply energy associated with initialization from a separate memory store;
- Power-gating of configuration bit cells without the penalty of re-initialization power and time;
- Compatibility with lower supply voltages (no retention issues); and
- Incremental extension to two or more configuration images which may be selected at run time.

Figure 8:
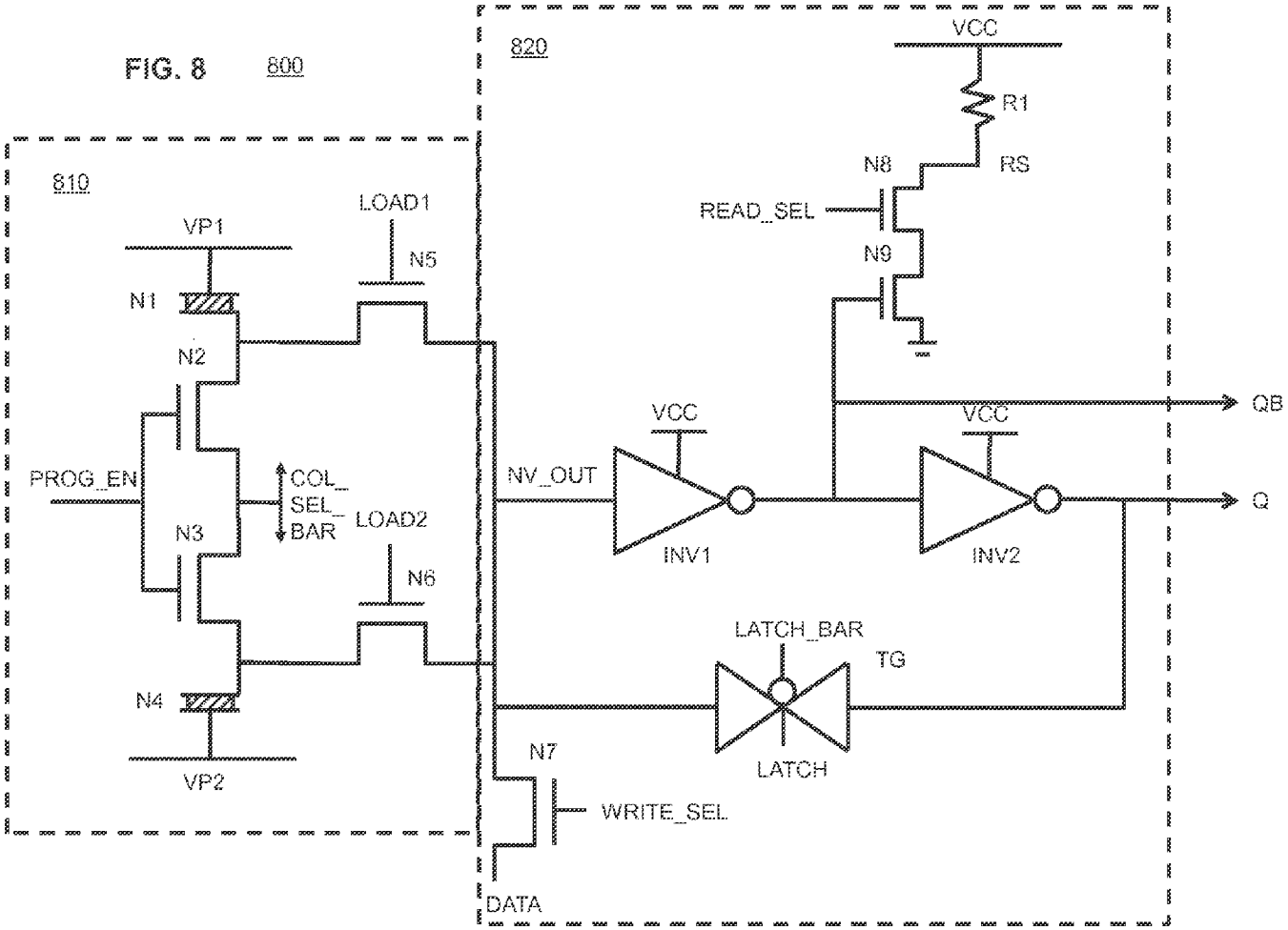
FIG. 8 is a schematic circuit diagram of a memory circuit for storing up to two bits of information, according to another embodiment of the invention.

FIG. 8 is a schematic circuit diagram of a memory circuit 800 for storing up to two bits of information, according to another embodiment of the invention. Memory circuit 800 is analogous to memory circuit 100 of FIG. 1, except that, instead of having a single transfer-enable signal LOAD controlling both transfer devices N5 and N6, NVM cell 810 of memory circuit 800 has two independent, transfer-enable signals LOAD1 and LOAD2 respectively controlling transfer devices N5 and N6. The VM cell 820 of memory circuit 800 is identical to the VM cell 120 of FIG. 1 and can be written to and read from using the same waveforms of FIG. 2. Memory circuit 800 can be used to independently store two different bit values: (1) a first bit value by selectively blowing or not blowing anti-fuse device N1 and (2) a second bit value by selectively blowing or not blowing anti-fuse device N4.

Figure 9:
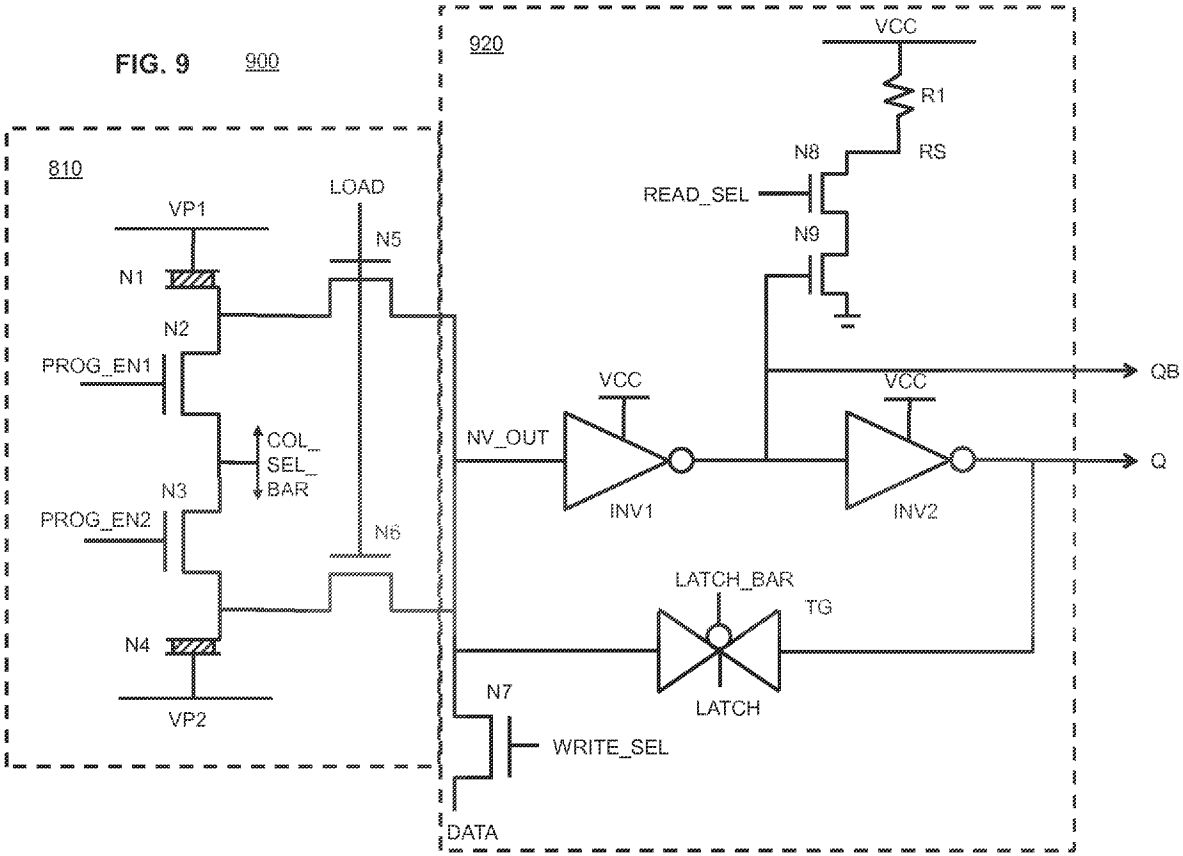
FIG. 9 is a schematic circuit diagram of a memory circuit with enhanced testability, according to another embodiment of the invention.

FIG. 9 is a schematic circuit diagram of a memory circuit 900 with enhanced testability, according to another embodiment of the invention. Memory circuit 900 is analogous to memory circuit 100 of FIG. 1, except that, instead of having a single program-enable signal PROG_EN controlling both access devices N2 and N3, NVM cell 910 of memory circuit 900 has two independent, program-enable signals PROG_EN1 and PROG_EN2 respectively controlling access devices N2 and N3. The VM cell 920 of memory circuit 900 is identical to the VM cell 120 of FIG. 1 and can be written to and read from using the same waveforms of FIG. 2. Memory circuit 900 can be used to independently test the device chain of N2 and N5 from the device chain of N3 and N6, by applying suitable voltages to PROG_EN1, PROG_EN2, and COL_SEL_BAR.

Although the invention has been described in the context of NVM cells that rely on anti-fuse devices to vary resistance levels, the invention can also be implemented in the context of NVM cells that rely on fuse devices to vary resistance levels. For example, suitable resistors that are susceptible to permanent electromigration when large voltage differentials are applied can be used as programmable devices in NVM cells of the invention. In either case, an NVM cell of the invention has one or more programmable devices that can be programmed to program a desired bit value into the NVM cell by varying one or more resistance levels in the NVM cell that alter the output voltage of the NVM cell that is presented during a transfer operation.

The invention has been described in the context of memory circuits implemented using N-type devices. Those skilled in the art will understand that the invention can also be implemented in the context of memory circuits implemented using P-type devices.

Memory circuits of the invention can be fabricated using the standard complementary metal-oxide semiconductor (CMOS) process flow and in particular one that does not have process steps for forming flash cells. Since the anti-fuse devices N1 and N4 function as programmable capacitors, the anti-fuse devices can be fabricated as either capacitors or MOS transistors. Similarly, access devices N2 and N3 and/or transfer devices NS and N6 can be implemented using types of switches other than individual transistors. Note that, when transfer devices N5 and N6 are transistors, the LOAD voltage needs to be sufficiently greater than the supply voltage VCC applied to the anti-fuse devices N1 and N4 in order to turn on N5 and N6. The devices described in this application can be manufactured with bulk CMOS technology, as well as silicon-on-insulator (SOI) technology.

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

Signals and corresponding terminals, nodes, ports, or paths may be referred to by the same name and are interchangeable for purposes here.

Transistors are typically shown as single devices for illustrative purposes. However, it is understood by those with skill in the art that transistors will have various sizes (e.g., gate width and length) and characteristics (e.g., threshold voltage, gain, etc.) and may consist of multiple transistors coupled in parallel to get desired electrical characteristics from the combination. Further, the illustrated transistors may be composite transistors.

Integrated circuits have become increasingly complex. Entire systems are constructed from diverse integrated circuit sub-systems. Describing such complex technical subject matter at an appropriate level of detail becomes necessary. In general, a hierarchy of concepts is applied to allow those of ordinary skill to focus on details of the matter being addressed.

Describing portions of a design (e.g., different functional units within an apparatus or system) according to functionality provided by those portions is often an appropriate level of abstraction, since each of these portions may themselves comprise hundreds of thousands, hundreds of millions, or more elements. When addressing some particular feature or implementation of a feature within such portion(s), it may be appropriate to identify substituent functions or otherwise characterize some sub-portion of that portion of the design in more detail, while abstracting other sub-portions or other functions.

A precise logical arrangement of the gates and interconnect (a netlist) implementing a portion of a design (e.g., a functional unit) can be specified. How such logical arrangement is physically realized in a particular chip (how that logic and interconnect is laid out in a particular design) may differ in different process technologies and/or for a variety of other reasons. Circuitry implementing particular functionality may be different in different contexts, and so disclosure of a particular circuit may not be the most helpful disclosure to a person of ordinary skill. Also, many details concerning implementations are often determined using design automation, proceeding from a high-level logical description of the feature or function to be implemented. In various cases, describing portions of an apparatus or system in terms of its functionality conveys structure to a person of ordinary skill in the art. As such, it is often unnecessary and/or unhelpful to provide more detail concerning a portion of a circuit design than to describe its functionality.

Functional modules or units may be composed of circuitry, where such circuitry may be fixed function, configurable under program control or under other configuration information, or some combination thereof. Functional modules themselves thus may be described by the functions that they perform, to helpfully abstract how some of the constituent portions of such functions may be implemented. In some situations, circuitry, units, and/or functional modules may be described partially in functional terms, and partially in structural terms. In some situations, the structural portion of such a description may be described in terms of a configuration applied to circuitry or to functional modules, or both.

Configurable circuitry is effectively circuitry or part of circuitry for each different operation that can be implemented by that circuitry, when configured to perform or otherwise interconnected to perform each different operation. Such configuration may come from or be based on instructions, microcode, one-time programming constructs, embedded memories storing configuration data, and so on. A unit or module for performing a function or functions refers, in some implementations, to a class or group of circuitry that implements the functions or functions attributed to that unit. Identification of circuitry performing one function does not mean that the same circuitry, or a portion thereof, cannot also perform other functions concurrently or serially.

Although circuitry or functional units may typically be implemented by electrical circuitry, and more particularly, by circuitry that primarily relies on transistors fabricated in a semiconductor, the disclosure is to be understood in relation to the technology being disclosed. For example, different physical processes may be used in circuitry implementing aspects of the disclosure, such as optical, nanotubes, micro-electrical mechanical elements, quantum switches or memory storage, magnetoresistive logic elements, and so on. Although a choice of technology used to construct circuitry or functional units according to the technology may change over time, this choice is an implementation decision to be made in accordance with the then-current state of technology.

Embodiments according to the disclosure include non-transitory machine readable media that store configuration data or instructions for causing a machine to execute, or for configuring a machine to execute, or for describing circuitry or machine structures (e.g., layout) that can execute or otherwise perform, a set of actions or accomplish a stated function, according to the disclosure. Such data can be according to hardware description languages, such as HDL or VHDL, in Register Transfer Language (RTL), or layout formats, such as GDSII, for example.

Unless explicitly stated otherwise, each numerical value and range should be interpreted as being approximate as if the word "about" or "approximately" preceded the value or range.

It will be further understood that various changes in the details, materials, and arrangements of the parts which have been described and illustrated in order to explain embodiments of this invention may be made by those skilled in the art without departing from embodiments of the invention encompassed by the following claims.

In this specification including any claims, the term "each" may be used to refer to one or more specified characteristics of a plurality of previously recited elements or steps. When used with the open-ended term "comprising," the recitation of the term "each" does not exclude additional, unrecited elements or steps. Thus, it will be understood that an apparatus may have additional, unrecited elements and a method may have additional, unrecited steps, where the additional, unrecited elements or steps do not have the one or more specified characteristics.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

The embodiments covered by the claims in this application are limited to embodiments that (1) are enabled by this specification and (2) correspond to statutory subject matter. Non-enabled embodiments and embodiments that correspond to non-statutory subject matter are explicitly disclaimed even if they fall within the scope of the claims.

What is claimed is:

1. An article of manufacture comprising a memory circuit comprising:

volatile output circuitry (VOC); and a programmable non-volatile memory (NVM) cell configured to generate an NVM output signal indicative of a program state of the NVM cell, the NVM cell comprising:

a first [anti-fuse device] *non-volatile memory element*;

a second [anti-fuse device] *non-volatile memory element*;

a first select device connected in series with the first [anti-fuse device] *non-volatile memory element* at a first node, *wherein the first select device has a first terminal and a second terminal*;

a second select device connected in series with the second [anti-fuse device] *non-volatile memory element* at a second node, *wherein the second select device has a first terminal and a second terminal, wherein the first select device's first terminal is connected to the second select device's first terminal, and wherein the first select device's second terminal is connected to the second select device's second terminal*;

a first pass device connected between the first node and a VOC input node of the volatile output circuitry and usable to selectively pass a voltage at the first node to the VOC input node; and a second pass device connected between the second node and the VOC input node and usable to selectively pass a voltage at the second node to the VOC input node, wherein the volatile output circuitry is connected to receive the NVM output signal from the NVM cell at the VOC input node and generate a VOC output signal indicative of the program state of the NVM cell.

2. The article of claim 1, wherein the VOC comprises a first inverter [(e.g., INV1)] comprising an input to receive the NVM output signal and to generate a first inverted signal at an output as the VOC output signal.

3. The article of claim 1, wherein the volatile output circuitry is an SRAM cell, *wherein the first non-volatile memory element is configured to be programmed by applying a first programmable voltage on the first non-volatile memory element, and wherein the second non-volatile memory element is configured to be programmed by applying a second programmable voltage on the second non-volatile element*.

4. The article of claim 1, wherein:

*the first non-volatile memory element is a first anti-fuse device and the second non-volatile memory element is a second anti-fuse device;* the NVM cell is programmable to have a first programmed state by (i) turning off the first pass device and (ii) turning on the first select device to apply a programmable voltage level across a gate oxide layer of the first anti-fuse device to create a permanent breakdown path through the gate oxide layer of the first anti-fuse device;

the NVM cell is programmable to have a second programmed state different from the first programmed state by (i) turning off the second pass device and (ii) turning on the second select device to apply a programmable voltage level across a gate oxide layer of the second anti-fuse device to create a permanent breakdown path through the gate oxide layer of the second anti-fuse device; and the volatile output circuitry is drivable using the NVM cell by (i) turning off the first and second select devices, (ii) applying read voltages to the first and second anti-fuse devices' gates, and (iii) turning on the first and second pass devices to pass a shorted voltage at the first and second nodes to the VOC input node.

5. The article of claim 4, wherein the volatile output circuitry is drivable by:

programming the NVM cell to have either the first or second programmed state; and then driving the volatile output circuitry using the NVM cell such that:

if the NVM cell is programmed in the first programmed state, then the NVM output signal drives the volatile output circuitry based on the first programmed state; and if the NVM cell is programmed in the second programmed state, then the NVM output signal drives the volatile output circuitry based on the second programmed state.

6. The article of claim 4, wherein the NVM cell in operation implements a programmable voltage divider wherein in the first programmed state, the shorted voltage is on one side of a common-mode voltage for the NVM cell and in the second programmed state, the shorted voltage is on the other side of the common-mode voltage for the NVM cell.

7. The article of claim 1, wherein: the first and second select devices are controllable by a common program-enable control signal; [and] *wherein* the first and second pass devices are controllable by a common transfer-enable control signal*; and wherein the first pass device is directly connected to the second pass device*.

8. The article of claim 1, wherein:

the first and second select devices are controllable by a common program-enable control signal;

*the first select device is directly connected in series with the first non-volatile memory element at the first node;*

*the first select device is directly connected to only one non-volatile memory element;*

*the second select device is directly connected in series with the second non-volatile memory element at the second node;*

*the second select device is directly connected to only one non-volatile memory element;* and the first and second pass devices are controllable by independent transfer-enable control signals.

[9. The article of claim 1, wherein:

the first and second select devices are controllable by independent program-enable control signals; and the first and second pass devices are controllable by a common transfer-enable control signal.]

10. The article of claim 1, wherein the memory circuit is part of an integrated circuit comprising multiple instances of the memory circuit distributed over the integrated circuit, wherein, for each instance of the memory circuit, the NVM cell is co-located with the volatile output circuitry.

11. The article of claim 10, wherein the integrated circuit is a field-programmable gate array.

12. A method for operating a programmable Non-Volatile Memory (NVM) cell configured to generate an NVM output signal indicative of a program state of the NVM cell, the NVM cell comprising:

a first [anti-fuse device] *non-volatile memory element*;

a second [anti-fuse device] *non-volatile memory element*;

a first select device connected in series with the first [anti-fuse device] *non-volatile memory element* at a first node;

a second select device connected in series with the second [anti-fuse device] *non-volatile memory element* at a second node;

a first pass device connected between the first node and a NVM output node of [the] volatile output circuitry and usable to selectively pass a voltage at the first node to the NVM output node; and a second pass device connected between the second node and the NVM output node and usable to selectively pass a voltage at the second node to the NVM output node, the method comprising reading a bit value from the NVM cell by:

turning off the first select device;

applying a read voltage to the first [anti-fuse device's] *non-volatile memory element's* gate; and turning on the first pass device to pass [a] *the* voltage at the first node to the NVM output node, wherein:

when the first [anti-fuse device is blown] *non-volatile memory element is programmed*, the voltage at the first node passed to the NVM output node will be at a first level;

when the first [anti-fuse device is not blown] *non-volatile memory element is not programmed*, the voltage at the first node passed to the NVM output node will be at a second level different from the first level; and turning off the first select device comprises turning off the first and the second select devices;

applying a read voltage to the first [anti-fuse device's] *non-volatile memory element* gate comprises applying read voltages to the gates of the first and the second [anti-fuse devices] *non-volatile memory elements*; and turning on the first pass device comprises turning on the first and the second pass devices to pass a shorted voltage at the first and second nodes to the NVM output node, wherein:

if the first [anti-fuse device is blown] *non-volatile memory element is programmed* and the second [anti-fuse device is not blown] *non-volatile memory element is not programmed*, the shorted voltage passed to the NVM output node will be at [a] *the* first level; and if the first [anti-fuse device is not blown] *non-volatile memory element is not programmed* and the second [anti-fuse device is blown] *non-volatile memory element is programmed*, the shorted voltage passed to the NVM output node will be at [a] *the* second level different from the first level.

13. The method of claim 12, wherein the NVM cell functions as a programmable voltage divider such that: when the first [anti-fuse device is blown] *non-volatile memory element is programmed* and the second [anti-fuse device is not blown] *non-volatile memory element is not programmed*, the shorted voltage is on one side of a common-mode voltage for the NVM cell and when the first [anti-fuse device is not blown] *non-volatile memory element is not programmed* and the second [anti-fuse device is blown] *non-volatile memory element is programmed*, the shorted voltage is on the other side of the common-mode voltage for the NVM cell.

14. A method for operating a programmable Non-Volatile Memory (NVM) cell configured to generate an NVM output signal indicative of a program state of the NVM cell, the NVM cell comprising:

a first [anti-fuse device] *non-volatile memory element*;

a second [anti-fuse device] *non-volatile memory element*;

a first select device connected in series with the first [anti-fuse device] *non-volatile memory element* at a first node;

a second select device connected in series with the second [anti-fuse device] *non-volatile memory element* at a second node;

a first pass device connected between the first node and a NVM output node of [the] volatile output circuitry and usable to selectively pass a voltage at the first node to the NVM output node; and a second pass device connected between the second node and the NVM output node and usable to selectively pass a voltage at the second node to the NVM output node, the method comprising reading a bit value from the NVM cell by:

turning off the first select device;

applying a read voltage to the first [anti-fuse device's] *non-volatile memory element's* gate; and turning on the first pass device to pass [a] *the* voltage at the first node to the NVM output node, wherein:

when the first [anti-fuse device is blown] *non-volatile memory element is programmed*, the voltage at the first node passed to the NVM output node will be at a first level;

when the first [anti-fuse device is not blown] *non-volatile memory element is not programmed*, the voltage at the first node passed to the NVM output node will be at a second level different from the first level;

reading an other bit value from the NVM cell by: turning off the second select device; applying a read voltage to the second [anti-fuse device's] *non-volatile memory element's* gate; and turning on the second pass device to pass [a] *the* voltage at the second node to the NVM output node, wherein:

if the second [anti-fuse device is blown] *non-volatile memory element is programmed*, then the voltage at the second node passed to the NVM output node will be at a third level; and if the second [anti-fuse device is not blown] *non-volatile memory element is not programmed*, then the voltage at the second node passed to the NVM output node will be at a fourth level different from the third level.

15. A method for operating a programmable Non-Volatile Memory (NVM) cell configured to generate an NVM output signal indicative of a program state of the NVM cell, the NVM cell comprising:

a first [anti-fuse device] *non-volatile memory element*;

a second [anti-fuse device] *non-volatile memory element*;

a first select device connected in series with the first [anti-fuse device] *non-volatile memory element* at a first node;

a second select device connected in series with the second [anti-fuse device] *non-volatile memory element* at a second node;

a first pass device connected between the first node and a NVM output node of [the] volatile output circuitry and usable to selectively pass a voltage at the first node to the NVM output node; and a second pass device connected between the second node and the NVM output node and usable to selectively pass a voltage at the second node to the NVM output node, the method comprising reading a bit value from the NVM cell by:

turning off the first select device;

applying a read voltage to the first [anti-fuse device's] *non-volatile memory element* gate; and turning on the first pass device to pass [a] *the* voltage at the first node to the NVM output node, wherein:

when the first [anti-fuse device is blown] *non-volatile memory element is programmed*, the voltage at the first node passed to the NVM output node will be at a first level;

when the first [anti-fuse device is not blown] *non-volatile memory element is not programmed*, the voltage at the first node passed to the NVM output node will be at a second level different from the first level; and prior to reading the bit value from the NVM cell, programming the bit value into the NVM cell by: turning off the first pass device; and turning on the first select device to apply a programmable voltage level across a gate oxide layer of the first [anti-fuse device] *non-volatile memory element* to create a permanent breakdown path through the gate oxide layer of the first [anti-fuse device] *non-volatile memory element*.

16. The method of claim 14, further comprising, prior to reading an other bit value from the NVM cell, programming the other bit value into the NVM cell by:

turning off the second pass device; and turning on the second select device to apply a programmable voltage level across a gate oxide layer of the second [anti-fuse device] *non-volatile memory element* to create a permanent breakdown path through the gate oxide layer of the second [anti-fuse device] *non-volatile memory element*.

17. The method of claim 12, further comprising controlling the first and second select devices by a common program-enable control signal and controlling the first and second pass devices by a common transfer-enable control signal.

18. The method of claim 12, further comprising controlling the first and second select devices by a common program-enable control signal and controlling the first and second pass devices by separate and independent transfer-enable control signals.

19. The method of claim 12, further comprising controlling the first and second select devices are by independent program-enable control signals and controlling the first and second pass devices by a common transfer-enable control signal.

20. An article of manufacture comprising a memory circuit comprising:

a programmable non-volatile memory (NVM) cell configured to generate an NVM output signal indicative of a program state of the NVM cell, the NVM cell comprising a first [anti-fuse device] *non-volatile memory element*, a first select device connected in series with the first [anti-fuse device] *non-volatile memory element* at a first node, and a first pass device;

a programmable volatile memory (VM) cell configured to receive the NVM output signal at a VM input node and to generate a VM output signal indicative of the program state of the VM cell, wherein the first pass device is connected between the first node and the VM input node and usable to selectively pass a voltage at the first node to the VM input node, and control logic configured to (i) program the NVM cell by turning off the first pass device and turning on the first select device to apply a program voltage level across a gate oxide layer of the first [anti-fuse device] *non-volatile memory element* to create a permanent breakdown path through the gate oxide layer and to (ii) cause the VM cell to be configured by the programmed NVM cell by turning off the first select device, applying a read voltage to a gate of the first [anti-fuse device] *non-volatile memory element*, and turning on the first pass device to change the voltage at the VM input node using sufficient current flow through the gate oxide layer of the first [anti-fuse device] *non-volatile memory element* by an amount sufficient to flip the VM output signal.

21. The article of claim 20, wherein when the NVM cell is not programmed, (i) the first [anti-fuse device is not blown] *non-volatile memory element is not programmed*, (ii) the NVM output signal is insufficiently definite for use in programming the VM cell, and (iii) the VM cell is programmable independent of the NVM output signal; and when the NVM cell is programmed, (i) the first [anti-fuse device is blown] *non-volatile memory element is programmed* and (ii) the NVM output signal is sufficiently definite for use in programming the VM cell.

22. The article of claim 20, wherein the VM cell is configurable by pre-programming the VM cell to have a first programmed state independent of the NVM output signal; and then configuring the VM cell using the NVM cell such that: if the NVM cell is not programmed, then the NVM output signal does not change the VM cell from the first programmed state; and if the NVM cell is programmed, then the NVM output signal does change the VM cell to a second programmed state different from the first programmed state.

23. The article of claim 20, wherein the memory circuit is part of an integrated circuit comprising multiple instances of the memory circuit distributed over the integrated circuit, wherein, for each instance of the memory circuit, the NVM cell is co-located with the VM cell.

* * * * *